United States Patent [19]

Pearson

[11] 4,439,917
[45] Apr. 3, 1984

[54] METHOD AND APPARATUS FOR AUTOMATICALLY EXTRACTING INTEGRATED CIRCUIT PACKAGES FROM ELECTRICAL SOCKETS

[76] Inventor: Rune S. Pearson, 2808 Oregon Ct. L-12, Torrance, Calif. 90503

[21] Appl. No.: 323,268

[22] Filed: Nov. 20, 1981

Related U.S. Application Data

[63] Continuation-in-part of Ser. No. 142,367, Apr. 21, 1980, abandoned.

[51] Int. Cl.³ .................... H01R 43/00; B23P 19/00
[52] U.S. Cl. ........................................ 29/825; 29/760; 29/573; 29/764; 29/741; 414/417
[58] Field of Search .................. 29/239, 741, 743, 758, 29/762, 764, 426.3, 426.5, 825, 760; 209/655, 911, 909, 573; 414/417; 228/20

[56] References Cited

U.S. PATENT DOCUMENTS

| | | | |
|---|---|---|---|
| 2,992,730 | 7/1981 | Rayburn et al. | 209/655 X |
| 3,832,764 | 9/1974 | Fletcher | 29/764 |
| 3,846,895 | 11/1974 | Cosham et al. | 29/764 |
| 3,896,935 | 7/1975 | Hjelle et al. | 209/573 |
| 4,022,370 | 5/1977 | Durney | 228/20 X |
| 4,234,418 | 11/1980 | Boissicat | 209/573 X |
| 4,304,514 | 12/1981 | Pfaff | 29/741 X |

*Primary Examiner*—Howard N. Goldberg
*Assistant Examiner*—Carl J. Arbes
*Attorney, Agent, or Firm*—Edward J. DaRin

[57] ABSTRACT

A method and apparatus for automatically extracting a series of integrated circuit packages from their sockets without bending the leads thereof. A plurality of extraction fingers are caused to be moved between a socket mounting an integrated circuit package and the package to an extent to permit the package to be extracted from its socket in a direction substantially perpendicular to the plane of the socket. The extracted packages are controlled after their release to cause them to travel through a checking station to determine the condition of their leads. The integrated circuit packages that have not been damaged will continue to travel down an incline and be accumulated. The damaged integrated circuit package will be held at the checking station and then ejected automatically from the apparatus during the operation of an extraction cycle.

24 Claims, 16 Drawing Figures

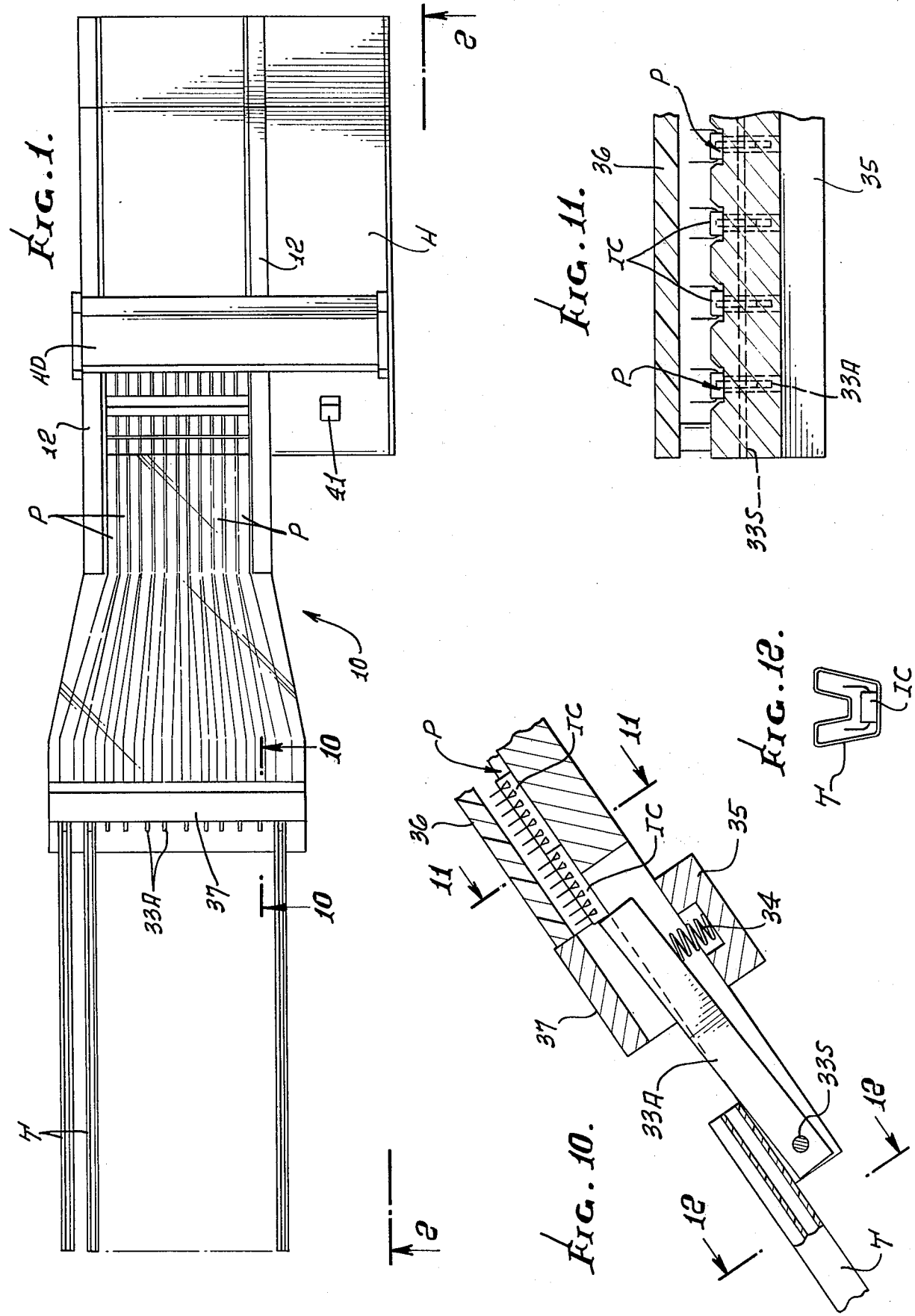

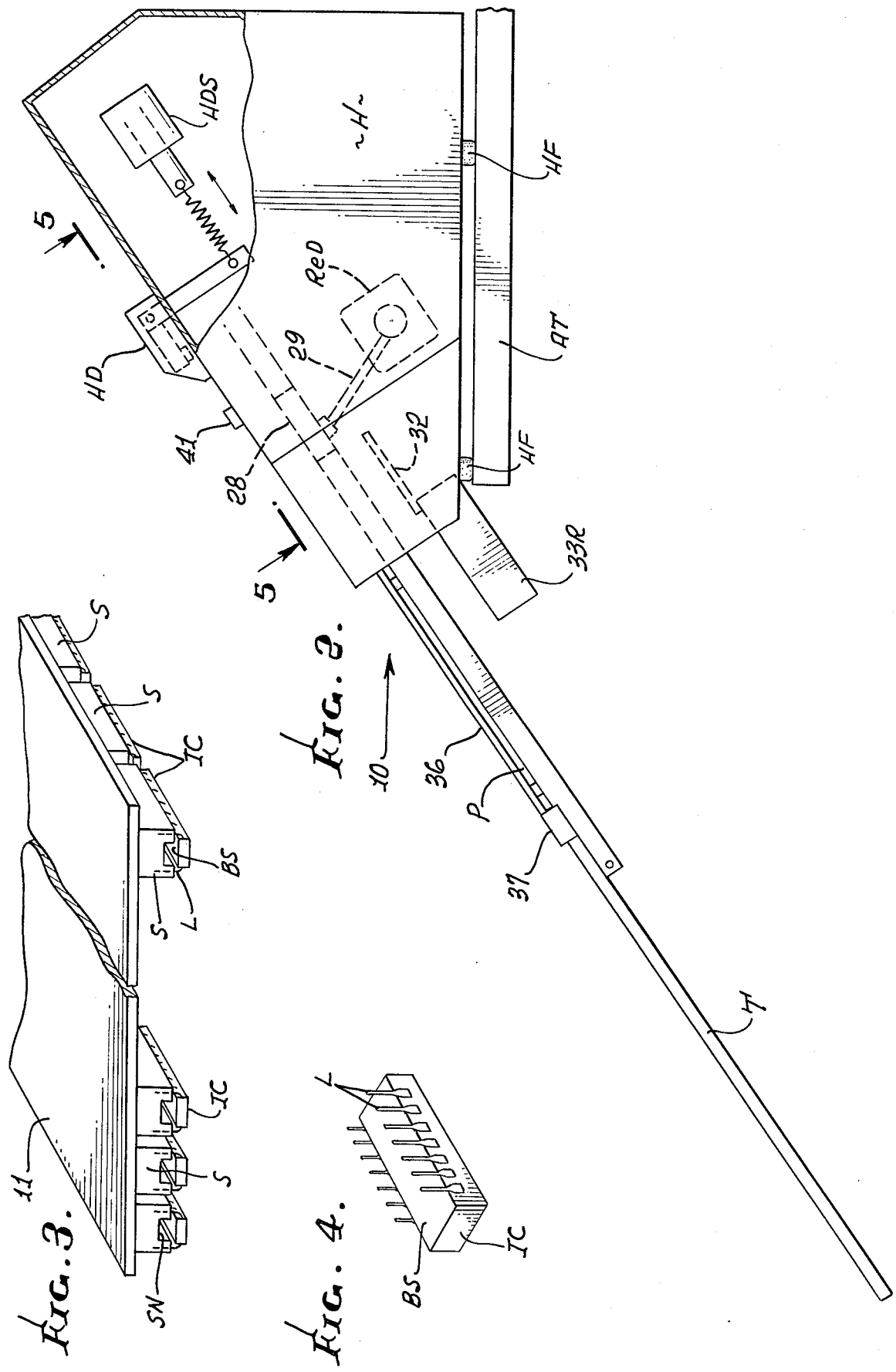

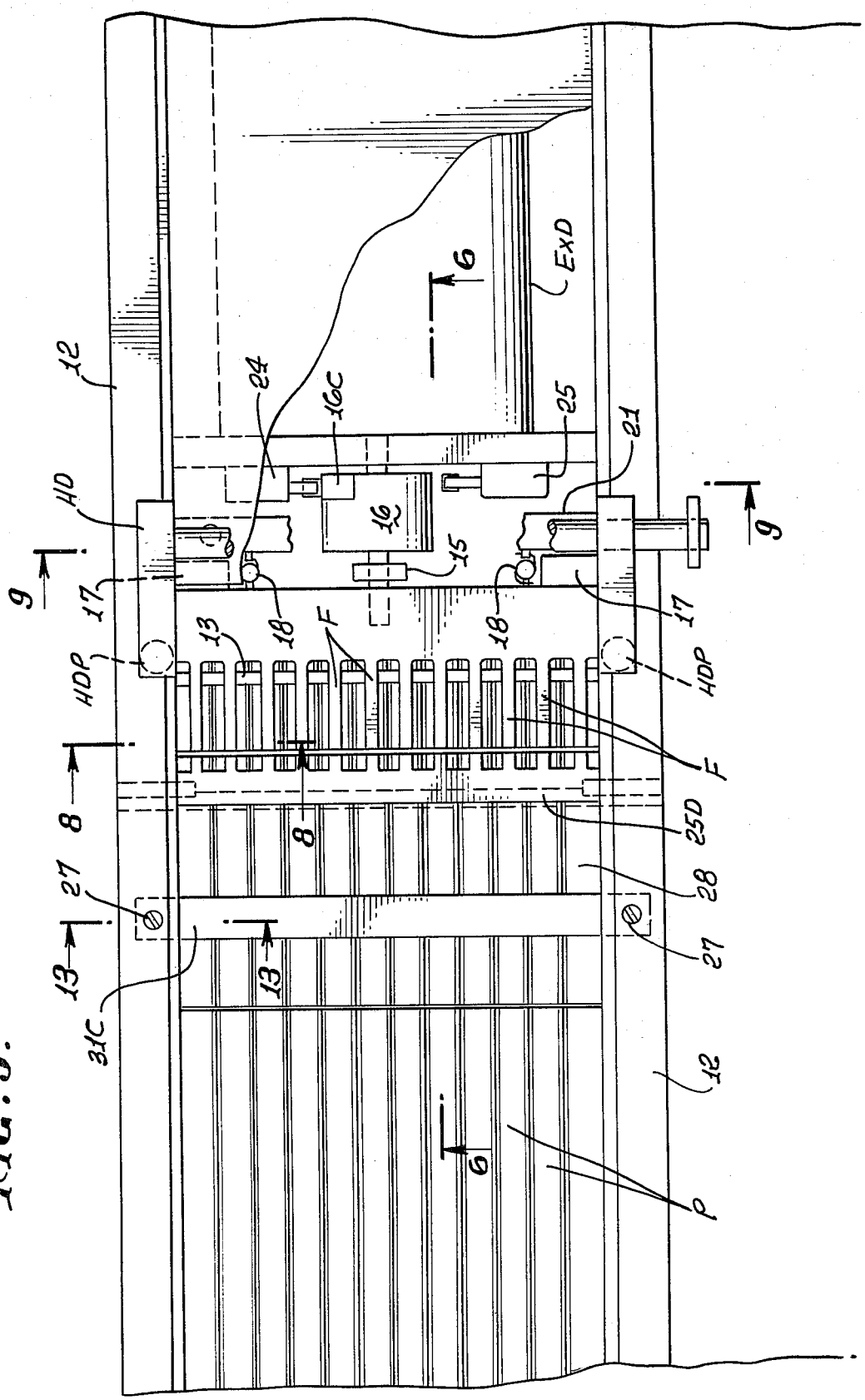

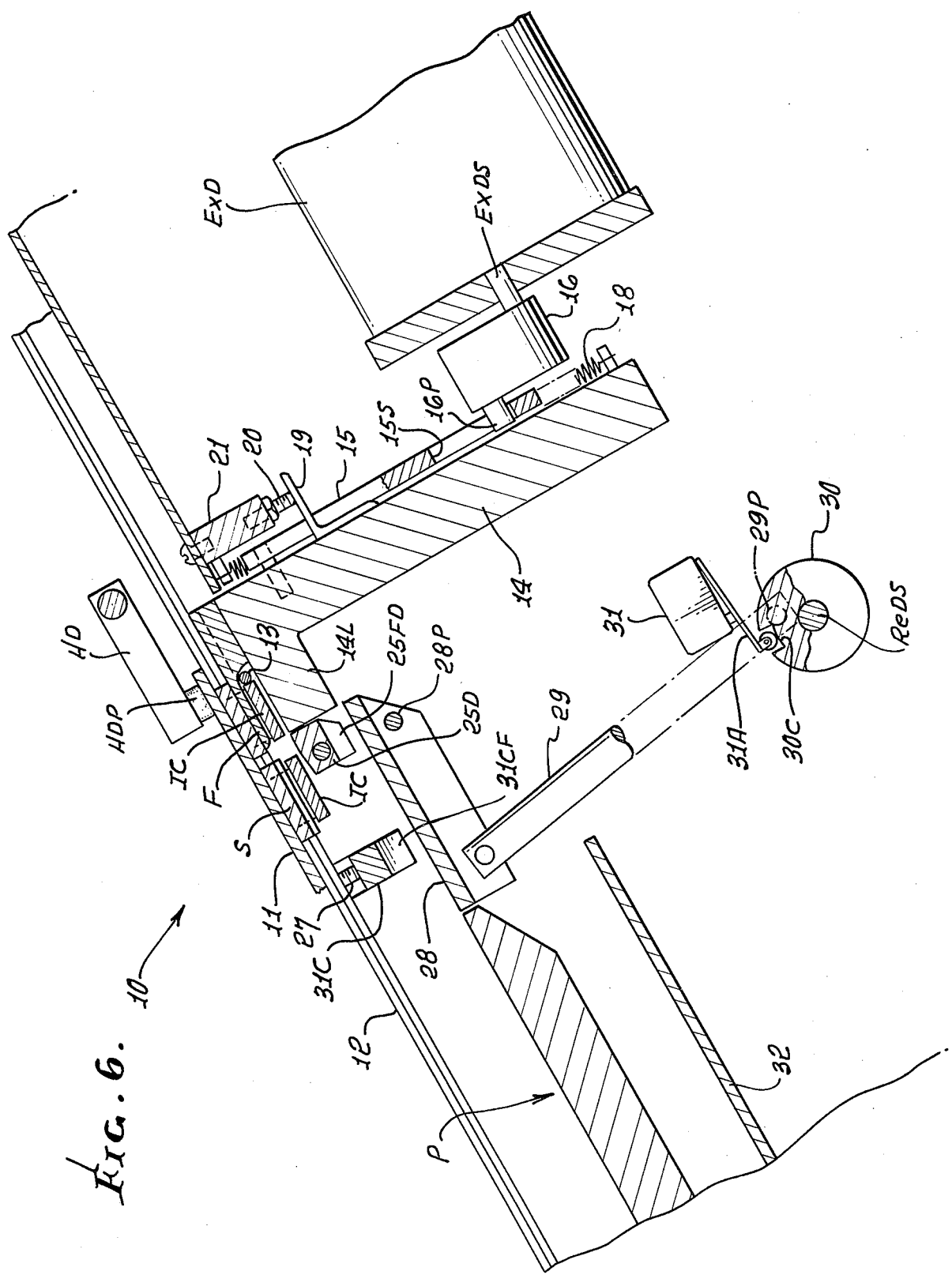

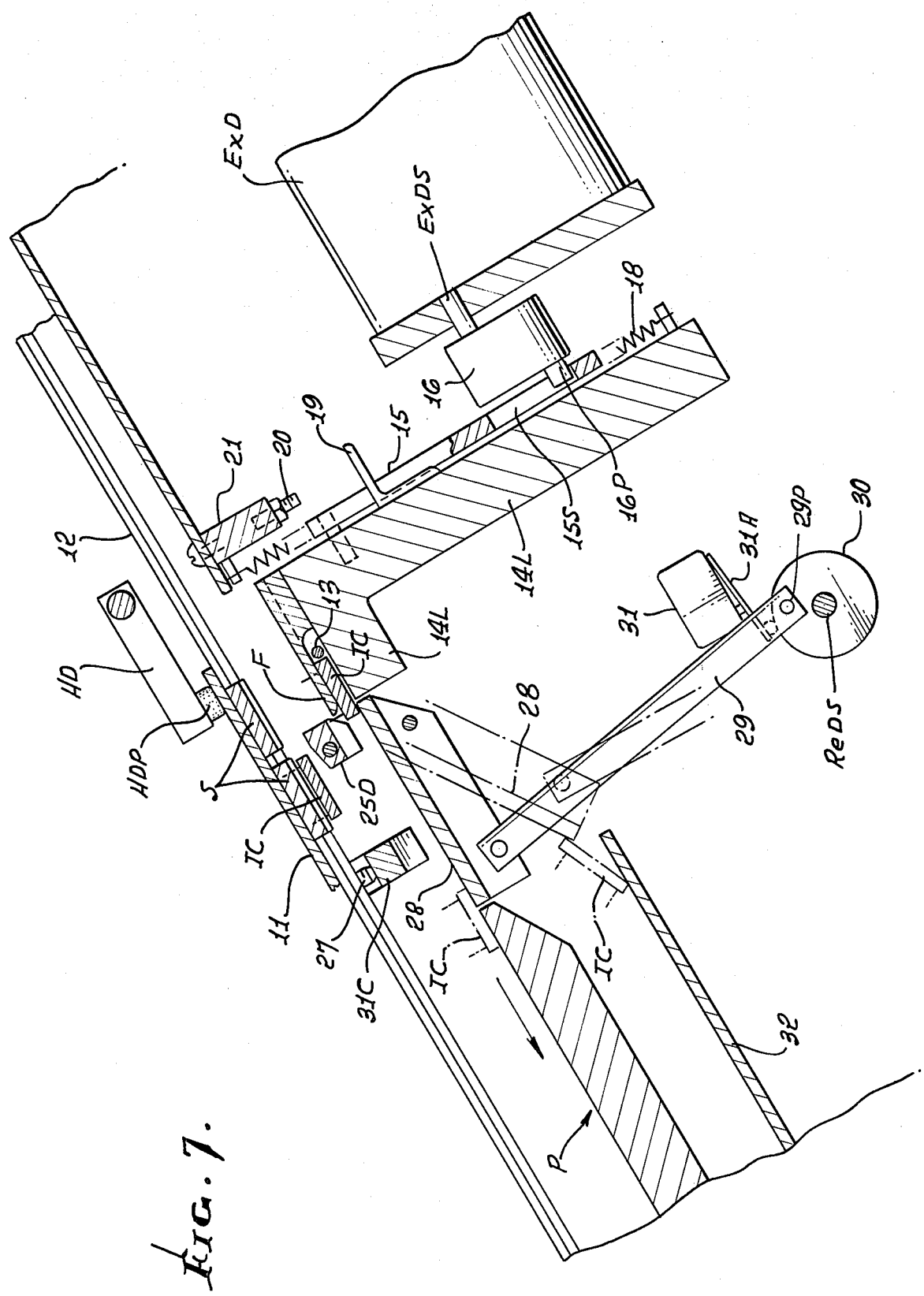

METHOD AND APPARATUS FOR AUTOMATICALLY EXTRACTING INTEGRATED CIRCUIT PACKAGES FROM ELECTRICAL SOCKETS

This application is a continuation-in-part of my co-pending application bearing Ser. No. 142,367 filed on Apr. 21, 1980, now abandoned and entitled "Method and Apparatus for Automatically Extracting Integrated Circuit Packages from Electrical Sockets".

FIELD OF INVENTION

This invention relates to a method and apparatus for automatically extracting integrated circuit packages from integrated circuit electrical sockets and, more particularly, to the removal of integrated circuit packages from sockets mounted on a burn in board and automatically checking the extracted integrated circuit packages for bent leads.

BACKGROUND OF INVENTION

Integrated circuit packages are presently in wide use in the electronics industry in various types of electronic equipment. Integrated circuit packages can be characterized as a high density device having a very high number of electrical circuits packaged therein in a very small area for performing various electronic functions. The circuits that are arranged in an integrated circuit package are not visible, and all that is visible in an inspection of the devices are the aligned, thin, external leads extending from the opposite sides of the package that allow it to be readily inserted into an integrated circuit socket. It has been determined that a bad integrated circuit package normally fails within about one year of the time of its initial use. The failure of an integrated circuit package in actual use can be very expensive. To eliminate such failures of integrated circuit packages in use, it has become common practice to test the integrated circuits in an oven for a period of time that is equivalent to having an integrated circuit package in actual operation for up to one year or more. This is known as a "burn in" process and is resorted to to eliminate any bad integrated circuit packages before they are actually put into use. While subjecting an integrated circuit package to a burn in test procedure is expensive, it is far less expensive than having a bad integrated circuit device fail in actual use. The burn in testing of the integrated circuit package is performed by the manufacturer of the integrated circuits, as well as numerous test facilities, and others.

The burn in procedure is accomplished by means of a burn in board which is in the form of a printed circuit board having integrated circuit sockets electrically connected to the printed circuit on the board. The integrated circuit sockets allow the integrated circuit packages to be readily inserted or removed, as required. A typical burn in printed circuit board will have 11 or 12 rows of integrated circuit sockets mounted thereon with 9 to 16 sockets per row, or approximately 110 to 165 sockets per burn in board. The sockets mounting the integrated circuit packages are electrically connected to the burn in board to allow the integrated circuits mounted on the board to be electrically operated while the entire board is in a burn in oven. The burn in oven is usually maintained at about 125 degrees Centigrade and the burn in board is kept in the oven 72 or more hours. This allows the integrated circuit package to be tested for the desired equivalent of one year of use in actual operation.

At the present time the removal or extraction of the integrated circuit packages from the burn in board or printed circuit board is accomplished manually. An operator inserts a wedge-like device underneath each integrated circuit package and applies pressure and moves the wedge-like device until the wedge forces the integrated circuit package out of the integrated circuit socket. The manual removal of the packages is accomplished one row at a time. The device is constructed so that the extracted integrated circuit package falls into a holding transport tube attached to the back end of the wedge used by the operator. The wedge forces the integrated circuit packages to be removed from the sockets so that the removal operations are not in a plane that is perfectly perpendicular to the board. In addition, in the use of the wedge-like devices, the operators often rock the wedge back and forth to facilitate the removal operation, and thereby reduce the force required for removal of an integrated circuit package. The wedge removal operations as described hereinabove have been found to cause the leads for the integrated circuit packages to bend, or even cause the integrated circuit package proper to break if excessive forces are employed. In order to detect such damage to integrated circuit packages, the operator must inspect each tube of extracted packages and, if damage is found, the entire tube of devices must be dumped out and then returned individually into the transport tube. The manual removal of the integrated circuit packages is fairly slow and physically tiring resulting in an extraction rate on the order of 1500 devices per man-hour. The subsequent checking and required manual handling of the removed packages brings the man-hour output down to 1,000 or less devices. As a result, it has been determined that the manual extraction of the integrated circuit packages from a burn in board, or similar printed circuit board, results in low productivity having an effective extraction rate on the order of 750 to 1,250 packages per man-hour. Also, since many parts are damaged, additional time is required for repair. Additional disadvantages are that all of the integrated circuit packages must be manually inspected. The broken integrated circuit circuits are a complete loss.

There have been attempts at automatic removal of integrated circuit packages by using a multiplicity of the aforementioned types of manual wedges mounted on a moveable carriage, which is manually moved by an operator. This tends to increase the production rate, but still leaves the problem of bent leads, as described hereinabove.

The present invention provides an improved and relatively inexpensive method and apparatus for automatically removing integrated circuit packages from a burn in board, or similar printed circuit boards, without bending the leads for the extracted integrated circuit packages. The apparatus can be readily operated without the need for any special skills or training and less effort is required by the operator than through the use of prior art devices. The method and apparatus of the present invention extracts the integrated circuit packages from the printed circuit boards perpendicular to the plane of the sockets to eliminate the problem of bent leads or broken parts. An operator utilizing the apparatus of the present invention can remove all the integrated circuit packages from a burn in board in accordance with the concept of the present invention in about 30 seconds, or remove 6,000 to 9,000 integrated circuit packages per man-hour. In addition to the machine extraction of the integrated circuit packages, the method and apparatus of the present invention automatically checks the extracted integrated circuit packages for bent leads and automatically separates the packages having bent leads from the undamaged integrated circuit packages. The undamaged integrated circuit packages are accumulated in a manner that permits ready visible inspection by an operator for damaged integrated circuits prior to removal from the machine. The undamaged integrated circuit packages are readily removed from the extraction apparatus by being insertible into a carrying tube adapted to use with the machine for transport to a point of use or shipment. The damaged integrated circuit devices are rejected into a receptacle for later straightening of the bent leads, or other operations, as the package requires.

These and other features of the present invention may be more fully appreciated when considered in the light of the following specification and drawings, in which:

FIG. 1 is a top plan view of the apparatus for extracting the integrated circuit packages from a burn in board, or similar printed circuit board and embodying the present invention;

FIG. 2 is a side elevational view, with portions broken away, of the apparatus of FIG. 1;

FIG. 3 is a partial perspective view of a typical burn in board with the integrated circuit packages illustrated mounted in the integrated circuit sockets as it would be oriented prior to insertion into the apparatus of FIGS. 1 and 2;

FIG. 4 is a perspective view of a typical integrated circuit package resting on its top side as it is extracted from its integrated circuit socket;

FIG. 5 is a partial view with portions broken away, of the apparatus taken along the line 5—5 of FIG. 2;

FIG. 6 is an elevational view with portions in section, taken along the line 6—6 of FIG. 5 and illustrating the burn in board mounted on the apparatus with the integrated circuit packages in a position to be extracted therefrom;

FIG. 7 is a view similar to FIG. 6, but at a later stage of the extraction procedure and illustrating the paths of the damaged and undamaged integrated circuit packages through the apparatus in dotted outline;

FIG. 10 is a partial, sectional view taken along the line 10—10 of FIG. 1;

FIG. 11 is a sectional view taken along the line 11—11 of FIG. 10 illustrating the extracted, undamaged, integrated circuit packages resting in the pathways of the apparatus;

FIG. 12 is a sectional view taken along the line 12—12 of FIG. 10 illustrating a typical transport tube to be used for holding and transporting the undamaged integrated circuit packages from the apparatus;

Figure 8:
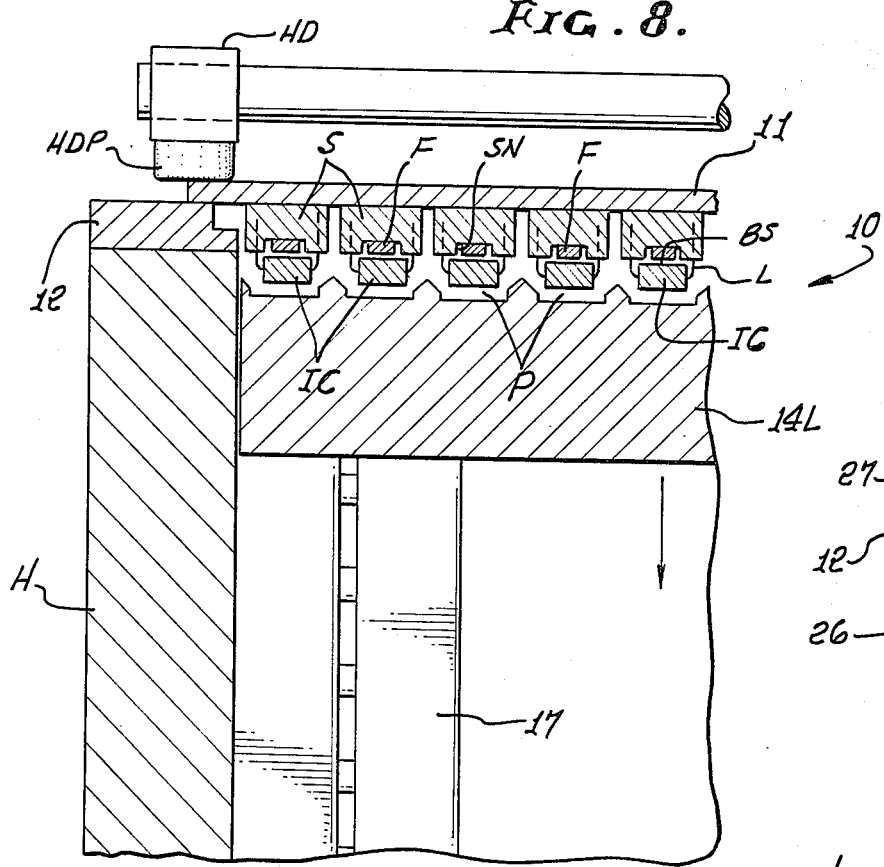
FIG. 8 is a partial sectional view taken along the line 8—8 of FIG. 5 and illustrating a burn in board mounted in position on the apparatus immediately after an extraction operation has been initiated.

Now referring to the drawings, the details of the apparatus 10 for extracting the integrated circuit packages will be explained. The general organization of the apparatus 10 comprises a plurality of pathways P arranged in parallel relationship with one another and at an inclined relationship with a horizontal plane to permit an extracted integrated circuit package IC to slide down an individual pathway P. The pathways P are illustrated as each having a transport tube T mounted at the ends thereof for receiving and storing the integrated circuit packages IC that slide into the tubes from inclined pathways P. The apparatus 10 is normally mounted on a table AT so that the housing H is supported thereon by its feet HF and to allow the pathways P and any tubes T attached thereto to extend outwardly therefrom; see FIG. 2. The apparatus 10 includes a printed circuit board hold down device HD for holding the printed circuit boards in a fixed position during the extraction operation. The extraction control apparatus is mounted within the housing H; see FIG. 2. The extraction apparatus 10 includes a plurality of extraction fingers F each being arranged in a longitudinal alignment with an individual pathway P and substantially centrally thereof. The extraction control apparatus includes an extraction drive motor ExD for moving the extraction fingers F through an extraction cycle; see FIG. 6. The extraction control apparatus includes a reject drive motor means ReD for ejecting damaged integrated circuit packages IC from the pathways P and the apparatus 10 proper.

Before further describing the apparatus 10, a brief understanding of the arrangement of the manner in which the integrated circuit packages IC are mounted will facilitate the understanding of the invention. The integrated circuit packages IC are mounted on sockets S on a printed circuit board 11 constructed and defined in the form of a burn in board 11 for testing the circuitry of the integrated circuit packages IC. The printed circuits deposited on the board 11 (not shown) are electrically connected to the integrated circuit sockets S and therethrough to the mounted integrated circuit packages IC. The sockets S are arranged on the board 11 in rows and columns. It should be noted that the integrated circuit sockets S, for the purposes of a burn in operation, have a notch SN arranged substantially centrally thereof and running longitudinally of the entire socket. This notch SN accommodates the extraction fingers F for the apparatus 10, as will be described hereinafter, to permit an entire row of packages IC to be simultaneously extracted. It will of course be appreciated that the integrated circuit packages IC are insertable into the contacts for the socket S by being slipped into the contacts and can be readily withdrawn from the contacts of the sockets S. A conventional, detached integrated circuit package IC illustrating its fragile leads L is illustrated in FIG. 4. Each of the leads L for the integrated circuit packages IC are accepted by an individual pair of contacts (not shown) on the socket S for effecting an electrical pressure contact with the socket S and thereby the printed circuit pattern on the board 11. The board 11 is illustrated in FIG. 3 in an upside down condition from its normal orientation wherein the sockets S and the integrated circuit packages IC are arranged on top of the board. The illustrated orientation is the orientation that the board 11 is mounted on the apparatus 10.

To align the burn in board 11 on the apparatus 10 guides 12 are provided and arranged adjacent each of the side edges of the apparatus 10 adjacent the hold down device HD to slideably receive the edges of the burn in board 11 thereon; see FIG. 8. The inner edges of the guides 12 engage the adjacent edges of the sockets S to thereby align the sockets and the mounted integrated circuit packages IC substantially centrally of the pathways P and thereby in longitudinal alignment with the fingers F. The burn in boards 11 are maintained in an extraction position by the operation of the board hold down device HD, with the aligned fingers F arranged in the socket notches SN as illustrated in FIG. 8 immediately upon initiation of an extraction cycle. The hold down device HD is normally spaced from the board 11 when it is mounted on the apparatus 10 to permit the board to be moved over the guides 12 and thereby the extraction fingers F to enter the notches SN for the sockets S. When the hold down device HD is actuated it will assume the hold down position illustrated in FIG. 8 with the soft, resilient pad HDP mounted on the end of the device HD to engage the adjacent edge of the burn in board 11 and hold it in a fixed position against the guide 12 during the entire extraction cycle. During this time interval the board 11 cannot be moved until the hold down device HD is released at the end of the extraction cycle. The board can then be moved upwardly to position the next row of sockets in position for another extraction cycle.

The extraction cycle of operation is initiated by moving the burn in board 11 along the guides 12 to cause the fingers F of the apparatus to engage the slots SN of the sockets S and slide along the back side BS of any integrated circuit package IC mounted thereon. The printed circuit board 11 is moved until the fingers F extend approximately three quarters of the length of the back sides BS for the integrated circuit packages IC and, in so doing, engages and moves an actuating rod 13 extending transversely of the pathways P; see FIG. 6. The rod 13 is effective to operate a microswitch 14S for powering the extraction control apparatus and initiating the extraction cycle, as will be described immediately hereinafter.

The extraction control apparatus includes an extraction arm 14 mounting the extraction fingers F to be moveable therewith. The extraction arm 14 is of a generally L-shaped construction oriented with the short arm 14L parallel to and elevated with respect to the inclined pathways P so as to receive an extracted integrated circuit package IC from the fingers F. The fingers F are mounted on the arm 14L in spaced relationship therewith to receive an integrated circuit package IC and the actuating rod 13 therebetween; see FIG. 6. The actuating rod 13 is arranged at the innermost position between the dependent portion of the fingers F and the top surface of the arm 14L to intercept an integrated circuit package IC moved thereagainst. The extraction arm 14 is driven by the extraction motor ExD through connecting linkage assembly 15 coupled to the extraction motor drive shaft ExDs through an extraction cam 16. The extraction cam 16 is mounted onto the drive shaft ExDs adjacent an end thereof to impart an eccentric action to the linkage 15. The entire extraction assembly driven by the motor ExD will move upwardly and downwardly on linear bearings 17, illustrated in FIGS. 5 and 8, in completing an extraction cycle.

Figure 9:
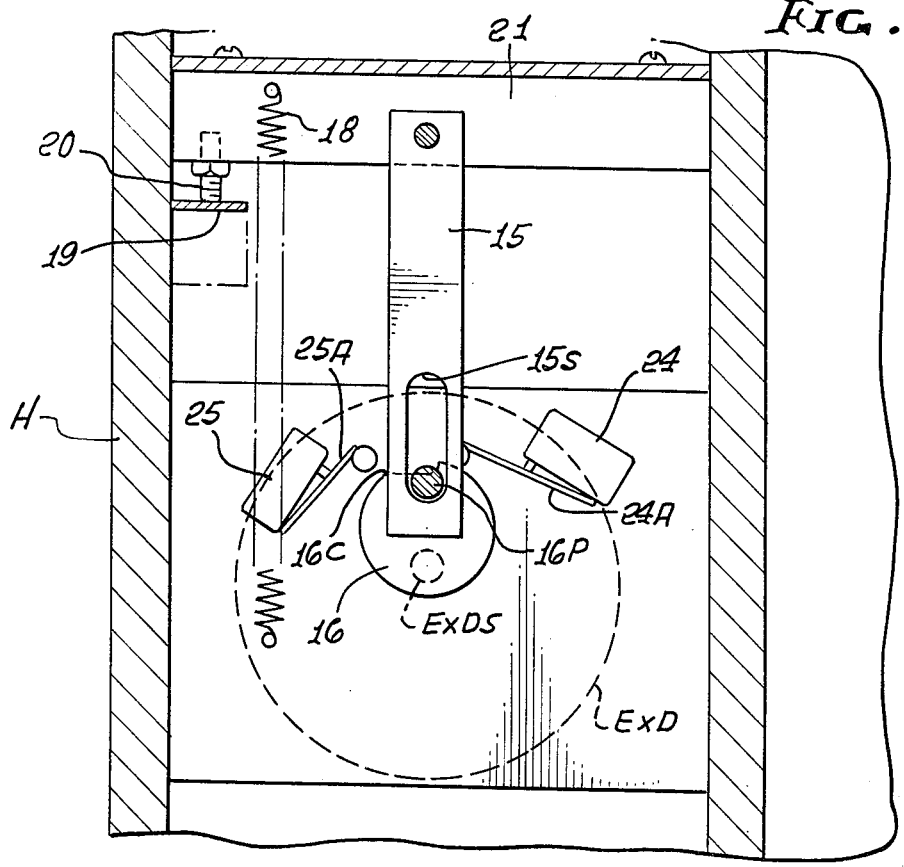
FIG. 9 is a sectional view taken along the line 9—9 of FIG. 5 illustrating the extraction drive motor cam and the control switches associated therewith.

The connecting linkage 15 is defined with a longitudinal slot 15S adjacent the lower end thereof, as illustrated in FIGS. 6 and 9, to receive and accomodate the cam pin 16P mounted adjacent the end of the extraction cam 16 opposite from the end secured to the drive shaft ExDs. This arrangement is to cause the drive motor ExD through the cam pin 16P to power the extraction arm 14 only in a downward direction. This is a safety feature to prevent an integrated circuit package IC from getting jammed at the extraction arm portion 14L. In the event that the integrated circuit package did not clear the portion 14L without this safety feature the package IC would be jammed in position by the upward drive force of the motor. The upward movement of the extraction arm 14 is provided by means of a pair of compression springs 18 mounted to the linkage 15 which are released during the upward travel of the cam pin 16P in the slot 15S. An angle element 19 is secured to the extraction arm 14 adjacent the drive motor side thereof to function as a stop for the upward travel of the arm 14. The travel of the angle 19 is arrested by means of an adjustable fastener 20 adjustably mounted to a support member 21 which in turn is secured to the sides of machine 10.

The extraction motor cam 16 is of a generally cylindrical configuration having a small segment 16C cut out, as illustrated in FIG. 9, for motor control purposes. The extraction cam 16 is defined for controlling the extraction cycle 1 and rejection cycle of operation. To this end, a microswitch 24 that is arranged to be in a normally nonconductive condition is mounted adjacent the extraction cam 16 so that its moveable switch operating arm 24A rides around the periphery of the cam 16 to control the conductive condition of the switch 24. The arm 24A is normally arranged to be just outside the cut out segment 16C of the cam 16 to maintain the switch 24 in a normally open condition, and to be closed when the contact for the arm 24A rides into the segment 16C and rides on the outer periphery of the cam 16 until it again reaches the high point to go to the normally open position. Similarly, a microswitch 25 is mounted with an operating arm 25A to ride on the outer surface of the cam 16 and to be controlled thereby. The microswitch 25 is also arranged to be normally in a nonconductive condition as a result of its operating arm 25A being normally spaced from the periphery of the cam 16. With the eccentric action of the cam 16, the cam will engage the arm 25A and momentarily actuate the switch 25 as will be described more fully hereinafter.

Arranged adjacent the forward portion 14L of the extraction arm 14 there is provided a dampener bar 25D extending transversely across the pathways P. The dampener bar 25D is provided to maintain the integrated circuit packages IC from tending to slide downwardly immediately after extraction from a socket S by actuating arm 14. The dampener bar 25D is constructed and defined to prevent the integrated circuit package IC from sliding downwardly until the extraction arm 14 has been moved to approximately the lower extremity of its travel. The dampener bar 25D is provided the plurality of dependent fingers 25FD that extend into the path of each of the released integrated circuit packages IC to hold them in position. The dampener bar 25D is of the same construction as the checking element 31C except that it is not adjustable. The checking element is illustrated in detail in FIG. 13. When the extraction arm 14L reaches its lower extremity, the packages IC should be in a position to slide underneath the fingers 25FD.

When the extraction arm 14 frees an integrated circuit package IC, the package will rest on the upper surface of the extraction arm 14L and move downwardly with the downward travel of the arm 14 until it reaches a position where it is aligned and parallel with a moveable platform 28. The moveable platform 28 is adapted to receive the freed integrated circuit packages IC as they pass through the dampener arm 25D. The position of the platform 28 is controlled to permit a package IC to either slide into a pathway P or to be ejected from the apparatus 10. The moveable shelf 28 is mounted with a control arm 29 adjacent its forward end so as to be adapted to pivot about its pivot rod 28P arranged at the opposite end in a counter-clockwise direction, as illustrated in dotted outline in FIG. 7. The control arm 29 is mounted to a rejection door cam 30 at a preselected location adjacent the outer periphery thereof by means of the pin 29P. In its normal position prior to the initiation of the extraction cycle the shelf 28 is aligned and parallel with the pathways P to permit an integrated circuit package to slide thereon and enter the pathways P, as illustrated in the drawings. The control arm 29 for the shelf 28 is mounted with the reject cam 30 to be driven by means of the shaft ReDS for the reject drive motor ReD. The cam 30 is mounted substantially centrally of the drive shaft ReDS for the reject door drive motor ReD, as illustrated in FIG. 6. The cam 30 has a cut out portion 30C which normally accomodates the roller associated with a moveable arm 31A for a microswitch 31. See FIG. 6. The microswitch 31 is adapted to be in a normally nonconductive condition as a result of riding in the cut out section 30C for the cam 30 and is rendered conductive when the moveable arm 31A rides out of the cut out section in response to the counter-clockwise rotation of the drive shaft ReDS. The energization of the reject drive motor ReD causes the control arm 29 to pull the moveable platform 28 in a counter-clockwise direction so that any integrated circuit package IC that remains thereon will drop along the inclined shelf 28 on to an inclined platform 32, as illustrated in FIG. 7. These rejected integrated circuit packages IC will slide along the inclined platform 32 and are received in a reject container 33R, see FIG. 2.

Figure 13:
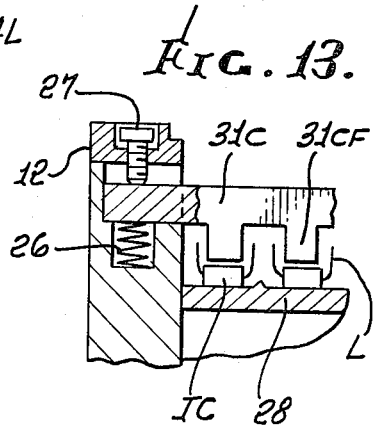
FIG. 13 is a sectional view taken along the line 13—13 of FIG. 5 of the checking station for the apparatus and illustrating the integrated circuit packages without bent leads moving therethrough.

During the transit of the integrated circuit packages IC along the top surface of the shelf 28 it encounters a checking element 31C which is constructed and defined to check the condition of the leads L of the integrated circuit packages IC to determine if they have been bent or misoriented during the extraction cycle. To this end the checking element 31C is constructed essentially identical to the configuration for the dampener bar 25D, but is adjustable as illustrated in FIG. 13. The amount of clearance between the fingers 25F and the support for the released packages IC may be controlled by means of a compression spring 26 mounted within the support for the bar 25D and which spring pressure may be adjusted by means of a fastener 27 arranged on the opposite side of the bar 25D from the spring 26. In this construction the integrated circuit packages IC that do not have bent leads L will pass through the checking station 31C and into individual pathways P. Any integrated circuit package IC that has a lead L that is bent will be arrested at the checking station 31C and maintained there for a preselected portion of the extraction cycle until all of the undamaged packages IC have entered the pathways P.

The integrated circuit packages IC that travel along the pathways P travel by gravity as a result of the pathways being on an incline until they engage an arresting element 33A mounted at the terminal end of each of the pathways P in the manner illustrated in FIG. 10. The arresting elements 33A each comprise an arm pivoted to the shaft 33S and are spring biased in an upward direction by means of spring 34 mounted in the U-shaped receptacle 35. The bias for the spring 34 is adjusted to move the arresting elements 33A upwardly into the paths of the pathways P so as to engage and abut the end of an integrated circuit package IC so that the packages IC are accumulated in an end to end relationship in the individual pathways P, as is evident from FIG. 10. The apparatus 10 is also provided with a plastic cover 36. The plastic cover 36 affords a ready visual inspection of the condition of the leads L for the integrated circuit packages IC and also prevents the integrated circuit packages IC from shingling, or moving over one another, during the accumulation periods. The cover 36 may be a metallic cover for antistatic protection when required. In any event, the cover 36 is removable. A transport tube T can be mounted to the end of each of the pathways P by inserting it between an arresting element 33A and its upper abutment 37 so as to cause the spring 34 to be compressed and hold the free end of the transport tube T in position between the elements 33A and 37. This will cause the arresting element 33A to be moved out of the path of the integrated circuit packages IC and to allow them to travel into the transport tube T automatically. The transport tube T has a generally U-shaped cross-section configuration and will receive the integrated circuit packages IC therein at the bottom of the U, as illustrated in FIG. 12.

As noted hereinabove, the structure for the checking station 31C is illustrated in FIG. 13. To properly function as a checking station, the bar 31C has the dependent fingers 31CF adjusted so that the lower end of the fingers will clear the integrated circuit package surface by 0.005 inches to 0.010 inches. With these dimensions, any integrated circuit package IC having leads L that are bent over or bent in will be stopped by the checking fingers 31CF for the station 31C and will be held there until the moveable platform 28 is operated to eject them from the apparatus 10.

Figure 14:
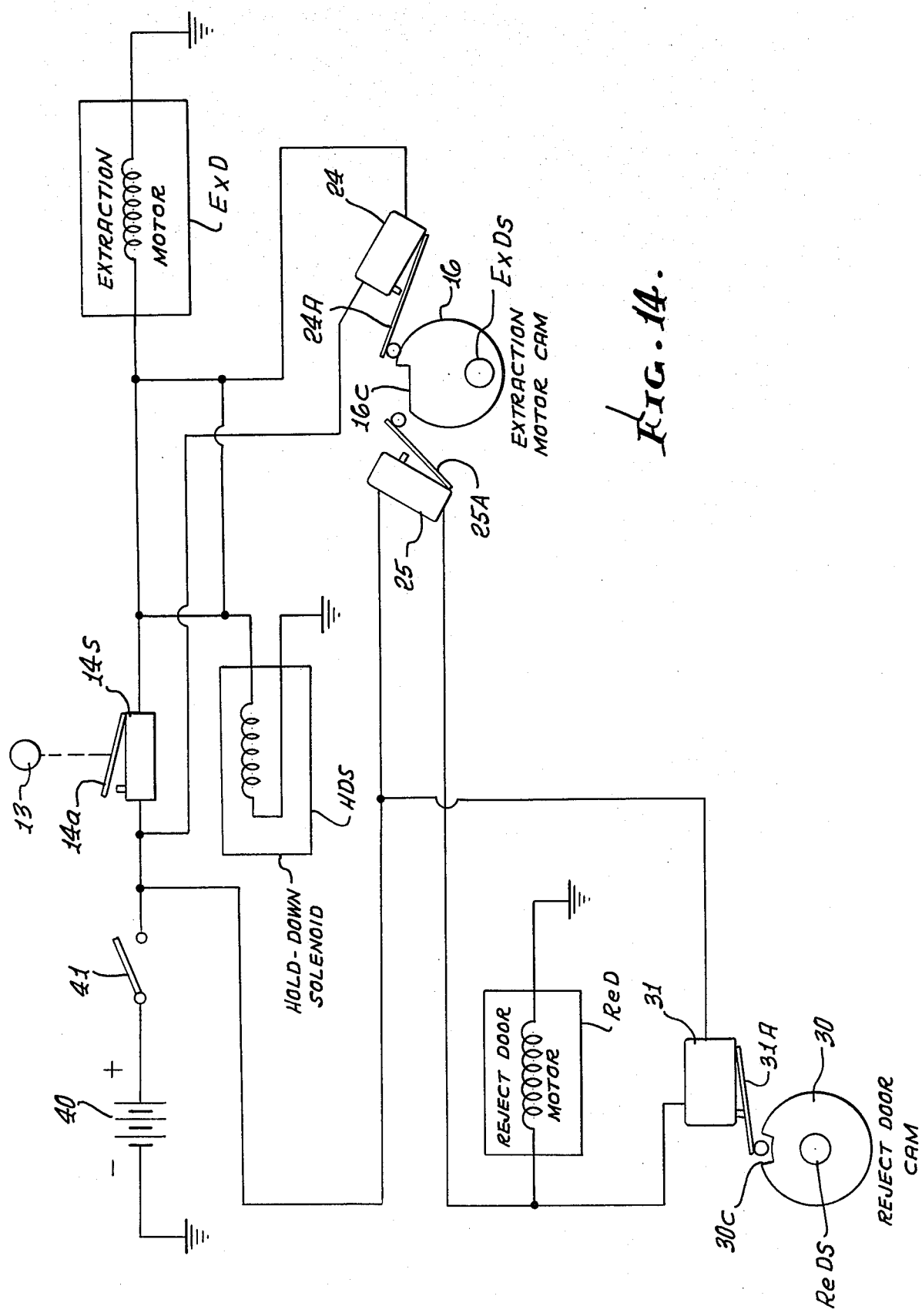
FIG. 14 is an electrical circuit diagram of the apparatus for controlling the sequence of operations of the extraction apparatus.

Now referring to FIG. 14, the electrical circuit diagram for controlling the operations of the apparatus 10 will be examined. The electrical elements illustrated in FIG. 14 are powered from a battery 40. It will be noted that an alternating current power source could be used, as well. The power from the battery 40 is arranged so that the negative terminal of the battery is connected to ground potential and the positive terminal is connected to an ON and OFF switch 41 which is mounted on the top surface of the housing H for the apparatus. The power switch 41 is arranged in series circuit relationship with an actuating microswitch, switch 14S, which is operated by means of the actuating rod 13. The switch 14S is a conventional microswitch which is normally arranged in an open circuit condition. The switch 14S has its contacts arranged in series circuit arrangement with the motor winding for the extraction drive motor ExD, as well as for the coil for the hold down solenoid HDS to be powered therethrough. When the power switch 41 is closed the movement of the board 11 will cause the package IC to move the actuating rod 13 against the actuating arm 14$^a$ to cause the control switch 14S to be rendered conductive and thereby render the extraction motor ExD and the hold down solenoid HDS operative. The operation of the hold down solenoid HDS will move the hold down device HD into engagement with the board 11 and maintain it in a fixed position on the guides 12 during the entire extraction cycle. The energization of the extraction motor ExD will cause the motor cam 16 to rotate in a clockwise condition. As a result of this rotation, the arm 24A for the microswitch 24 associated with the cam 16 will ride into the cut out section 16C for the cam 16 and operate or render the microswitch 24 conductive. The microswitch 24 is connected in series circuit with the positive side of the power switch 41 and provides a circuit path around the switch 14S for energizing the winding for the drive motor ExD and the solenoid HDS. This allows the extraction cycle to be completed by assuring that the extraction motor ExD is continuously energized even after the actuating rod 13 becomes disengaged from the contact arm 14$^a$ for the switch 14S. This disengagement results when the integrated circuit package IC is removed from a socket S with the opening of the contacts for the switch 14S. The energization of the extraction drive motor ExD and the hold down solenoid HDS is assured for one complete cycle as a result of the closed contact provided by the switch 24. As the cam 16 completes one rotation, the arm 24A for the switch 24 will again engage the highest point of the cam 16 to operate the arm 24A to open the switch 24 and thereby de-energize the drive motor ExD and the solenoid HDS completing a cycle of operation.

The energization of the drive motor ExD also is effective to cause the cam 16 to move into engagement with the operating arm 25A for the control switch 25 for the reject door drive motor ReD. The closing of the contacts for the switch 25 momentarily energizes reject door drive motor ReD. Once the motor ReD is energized it will cause the cam 30 coupled to its shaft ReDS to rotate in a counter-clockwise direction. This rotation of the cam 30 will cause the roller on the switch arm 31A to ride out of the cut out portion 30C and close the contacts for the switch 31 as a result of the upward movement of the actuating arm 31A. Therefore, with this operation of the switch 31, the winding for the reject door drive motor ReD will be energized for a complete cycle until the arm 31A again drops into the cam cut out section 30C to operate the switch to an open circuit condition.

With the above structure in mind, the operation of the apparatus 10 can now be explained in detail. The operation of the apparatus 10 is initiated by placing the board 11 on the guides 12 on the opposite edges of the apparatus 10 as illustrated in the drawings, upside down, after the power switch 41 is closed. The board 11 is then moved upwardly to cause the integrated circuit packages IC at the extreme row of sockets S to receive the extraction fingers F at the notches SN. The board 11 is moved until the packages IC engage the actuating rod 13.

At this time the fingers F will have traversed approximately 75 percent of the length of the packages IC. Once the actuating rod 13 is moved into engagement with the operating arm 14$^a$ for the control switch 14S to cause the switch to be operated, power will have been applied to the control apparatus as a result of the closed condition of the power switch 41 and the control switch 14S. The powering of the control apparatus will cause the hold down solenoid HDS to be energized and thereby pivot the hold down device HD downwardly to the board holding position as illustrated in FIGS. 6-8. This will prevent relative movement between the board 11 and the extraction fingers F. With the power applied to the extraction motor ExD, the motor cam 16 will begin to rotate in a clockwise direction. This will cause the extraction arm 14 to be pulled downwardly so as to cause the fingers F, and thereby the packages IC, to be moved perpendicularly away from the plane of the sockets S. After the extraction arm 14 is moved downwardly approximately 0.200 inches, the leads L of the integrated circuit packages IC are completely free of their sockets S and are supported on the portion 14L of the extraction arm 14. It will be recognized that all of the integrated circuit packages IC arranged in the same row are extracted from their respective sockets simultaneously.

Once the integrated circuit packages IC have been freed, they will move downwardly while resting on the portion 14L of the extraction arm 14 as it moves downwardly to its lower extremity. During this interval, the dampening bar 25D maintains the integrated circuit packages IC in position to prevent them from moving forwardly. After the arm 14 has reached its lower extremity, it will be in alignment with the moveable shelf 28 and allow the packages IC to move along the inclined surface provided by the platform 28 through the dampening element 25D to reach the checking element 31C. During the time interval the packages IC are at the checking station 31C the condition of the leads L of the packages IC will be checked and those that have not been damaged will continue their travel and enter the pathways P, the undamaged packages IC will travel down the incline, and will be accumulated by abutting either the member 33A at the terminal end of the individual pathways P, or will travel directly into the transport tube T. If the packages IC are arrested at the member 33A they can be further visually checked for the condition of their leads L, etc. by viewing them through the cover 36. After all of the integrated circuit packages IC that have not been damaged have traveled through the checking station 31C and are off the platform 28 (see FIG. 7), the cam 16 will then operate the switch 25 to energize the reject door motor ReD. The energization of the motor ReD will cause the cam 30 to rotate in a counter-clockwise direction and cause the operating arm 31A to close the control switch 31 to maintain the motor ReD in operation for a complete cycle. The operation of the motor ReD will cause the platform 28 to be tilted in a downward direction so that the packages IC that have been maintained at the checking station 31C will slide off the platform 28 onto the platform 32 to be ejected from the apparatus 10; see FIG. 7. From the platform 32 the packages IC will travel by means of gravity into the reject bin 33R. The continuous rotation of the cam 30 results from the operating arm 31A riding on the outer periphery of the cam 30 for a complete cycle until it again falls into the cut out section 30C, at which time it becomes de-energized and de-energizes the motor ReD.

During the time interval that the extraction drive motor ExD is being energized, after it has reached its lowermost position, the pin 16P for the motor cam 16 will ride upwardly in the slot 15S and will not drive the extraction arm 14 upwardly. The arm 14 will move upwardly under the urging of the springs 18 until its stop 29 abuts the fastener 20. With the completion of the rotation of the cam 16, the operating arm 24A for the switch 24 will again ride on the highest point of the cam 16C to de-energize the switch 24 and thereby de-energize the extraction drive motor ExD and the solenoid HDS. This will complete one extraction cycle. The de-energization of solenoid HDS will release the hold down device HD and the board 11 so the board can then be moved once again upwardly to allow the succeeding row of sockets S to be moved into a position for an extraction cycle to begin anew. The succeeding packages IC will be moved so that the fingers F move between the sockets S and the packages IC until the packages IC again engage and move the actuating rod 13 to once again energize the extraction drive motor and the hold down solenoid HD to initiate another extraction cycle. The same operations will prevail to cause the packages IC to be extracted, checked, accumulated, and the damaged packages IC to be rejected and stored in the bin 33R.

It will be recognized that as the packages IC are accumulated in the transport tubes T and the tubes T become filled, they may be removed from the apparatus 10. The tubes T are removed by pulling them forwardly out of the holding pressure provided between the elements 33A and 37 (see FIG. 10) to allow the spring 34 to urge the element 33A into an arresting position across the pathways P to accumulate the packages IC in the pathways in the absence of the tubes T, as illustrated in FIG. 11.

Figure 15:
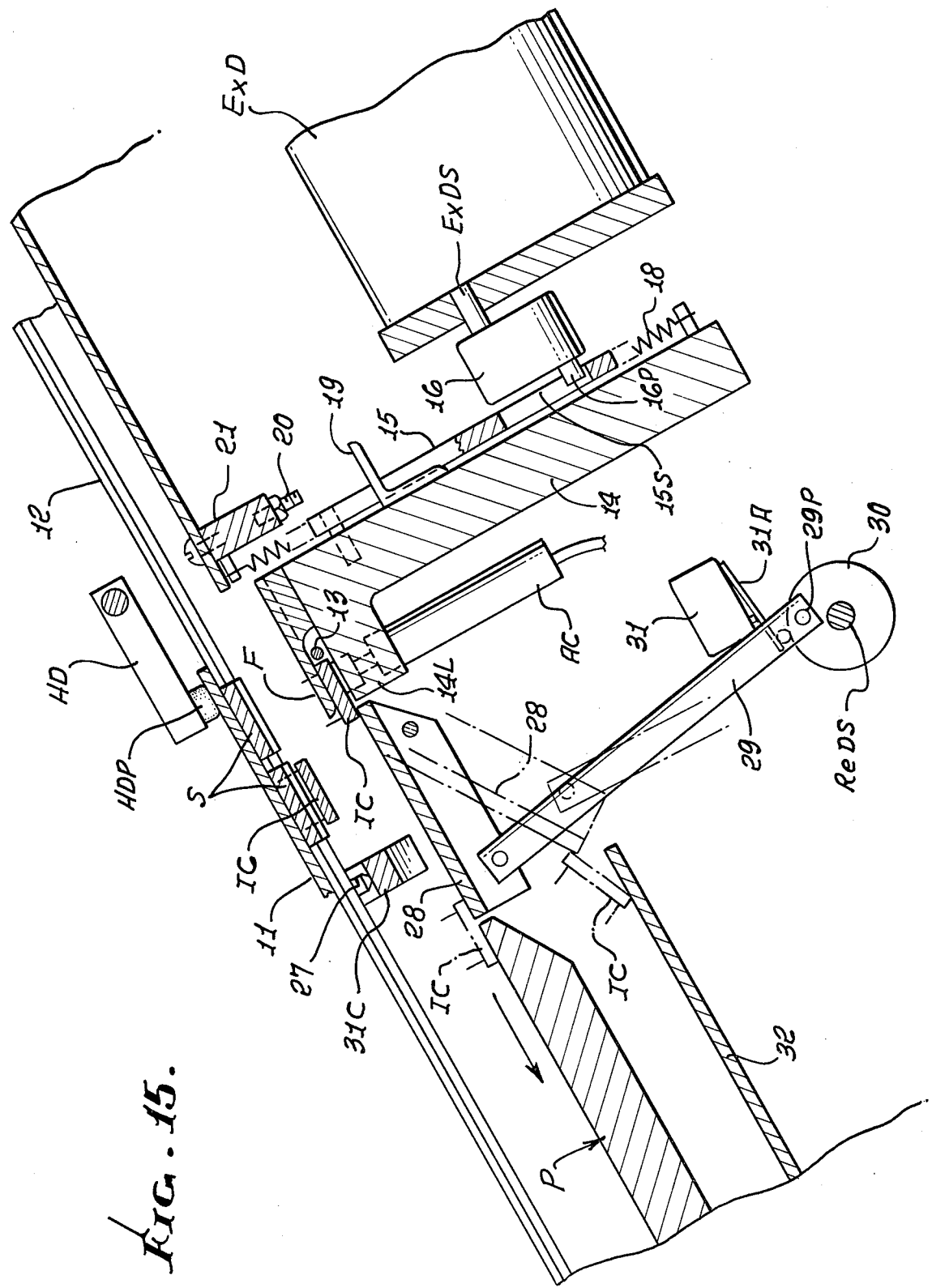
FIG. 15 is a view similar to FIG. 7, but illustrates a modification of the apparatus for supporting the integrated circuit packages during the extraction procedure.
Figure 16:
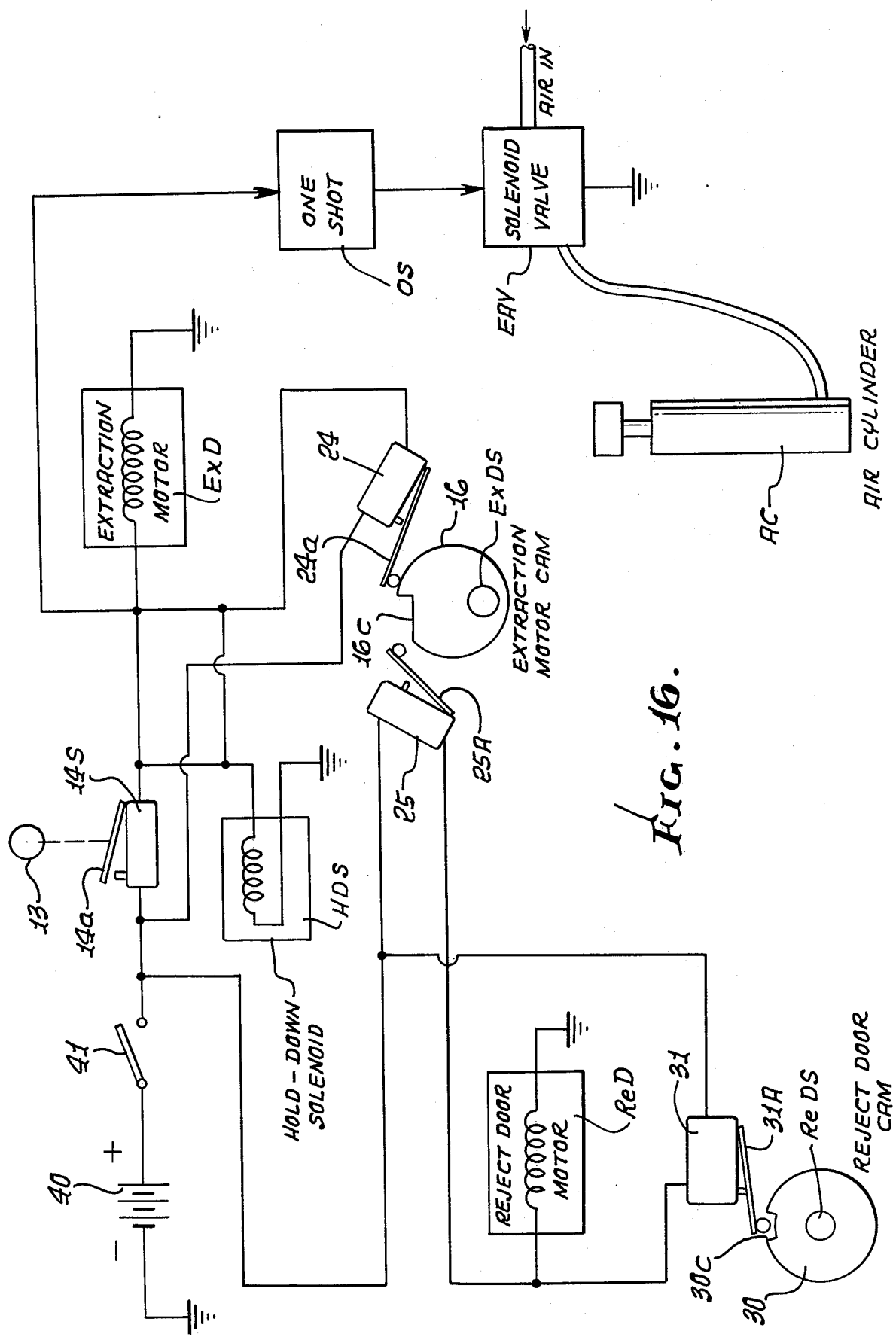
FIG. 16 is an electrical circuit diagram of the apparatus, as illustrated in FIG. 14 but including the elements for controlling the modified apparatus of FIG. 15.

The above described apparatus 10 operates satisfactorily, however, to prevent the integrated circuit packages IC from turning during the extraction procedure, the apparatus has been modified in accordance with FIGS. 15 and 16. FIG. 15 illustrates the modified apparatus which includes means for supporting the integrated circuit packages IC, illustrated in the form of an air cylinder AC, mounted to the forward portion 14L of the extraction arm 14. The air cylinder AC is mounted to the bottom side of the forward portion 14L so that when it is actuated, it will grip the integrated circuit package IC from below during the extraction cycle for momentarily supporting the packages IC, as illustrated in FIG. 15. This additional support of the packages IC during the extraction cycle prevents the packages IC from turning. The element AC is actuated at the start of the extraction cycle and holds the packages IC during their removal to prevent them from turning during removal. The element AC is controlled during the extraction procedure in a timed relationship to permit the packages IC to freely slide downwardly (as described hereinabove) only when the forward portion 14L of the extraction arm is in alignment with the movable platform 28, as illustrated. The remaining operation of the apparatus is as described hereinabove. The selection of the element AC in the form of an air cylinder takes advantage of the inherent overtravel of air cylinders so that they can grip packages IC of varying thicknesses. The addition of the element AC eliminates the need for the dampener bar 25D and the need for the manual adjustment of the forward portion 14L of the extraction arm in accordance with the varying thicknesses of the packages IC.

FIG. 16 illustrates the additional control elements that are required to control the actuation and deactuation of the element or air cylinder AC. The basic operation of the electrical circuit diagram FIG. 16 is the same as the operation described hereinabove for the circuit of FIG. 14 with the addition of the operation of the elements for controlling the element AC. For this purpose, the additional control components are connected to be controlled in response to the operation of the switch 14S. Accordingly, a timing device in the form of a one-shot multivibrator OS is connected to the switch 14S in parallel with the extraction motor EXD. The output signal from the element OS controls the actuation of an electric air valve EAV for controlling the actuation of the air cylinder AC. The valve EAV controls the application of the air to the air cylinder and thereby the actuation and deactuation of the element AC during the extraction procedure.

With the above modifications of the apparatus in mind, the modified sequence of operation can be examined. The operation of the control apparatus of FIG. 16 is initiated, as described hereinabove, in conjunction with FIG. 14. The modified apparatus is rendered operative after the switch 14S has been operated to a closed circuit condition. The operation of the switch 14S starts the extraction procedure, as described hereinabove, but in addition triggers the timing element OS to cause it to provide an output pulse of a preselected width in accordance with the desired time interval the element AC is actuated. The element OS is normally adjustable by means of a variable potentiometer or the like to control this time interval, as is conventional. The output pulse from the element OS actuates the electric valve EAV during the existance of the pulse and the valve in turn couples the air supply to the air cylinder AC to actuate it. The actuation of the element AC causes the piston thereof to be extended into engagement with the backside of a package IC. The package IC is held by the element AC between the element and the forward portion 14L of the extraction arm 14. Once the output pulse from the element OS terminates, the element AC is deactuated so that the piston for the air cylinder retracts downwardly to release the package IC. This is integrated into the operation of the control apparatus so that when the extraction arm 14 has reached its lower extremity, it will be in alignment with the movable shelf 28 and allow the packages IC to move along the inclined surface of the platform 28 and the operation continues as previously described hereinabove.

What is claimed is:

1. A method of extracting integrated circuit packages from integrated circuit sockets including the steps of
providing extraction apparatus having a plurality of extraction elements aligned transversely of the apparatus in a preselected location thereon,
positioning a printed circuit board having integrated circuit packages mouned on individual sockets on the board on the extraction apparatus with the integrated circuit packages extending downwardly from said board to permit relative movement between the board and the extraction elements to permit the extraction elements to be positioned a substantial distance between the integrated circuit packages and the electrical sockets therefor,
causing the apparatus to automatically and substantially simultaneously pull the integrated circuit packages from the electrical sockets in a direction substantially perpendicular to the plane of the electrical sockets to thereby remove the packages therefrom.

2. A method for extracting an integrated circuit packages from integrated circuit sockets as defined in claim 1 including the step of accumulating the removed packages on the apparatus at a point spaced from the point of removal of the package.

3. A method for extracting an integrated circuit package from an integrated circuit socket as defined in claim 1 including the step of holding the integrated circuit package during its removal from the electrical socket.

4. A method for extracting an integrated circuit package from an integrated circuit socket including the steps of
- providing extraction apparatus having a plurality of extraction elements aligned transversely of the apparatus in a preselected location,
- positioning a printed circuit board having an integrated circuit package mounted on an electrical socket on the board on the extraction apparatus to permit relative movement between the board and the extraction elements to permit the extraction elements to be positioned a substantial distance between the integrated circuit package and the electrical socket therefor,
- causing the apparatus to automatically pull the integrated circuit package from the electrical socket in a direction substantially perpendicular to the plane of the electrical socket to thereby remove the package therefrom,
- accumulating the undamaged packages at a preselected location on the apparatus spaced from the point of removal, and
- automatically checking the bent condition of the leads of a removed integrated circuit package while in transit on the apparatus from the point of removal.

5. A method for extracting an integrated circuit package from an integrated circuit socket as defined in claim 4 including the step of automatically separating an integrated circuit package having bent leads from the path transversed by the undamaged packages and then ejecting the packages having damaged leads from the apparatus.

6. A method for automatically extracting integrated circuit packages from electrical sockets mounted on a printed circuit board, the electrical sockets being mounted on the printed circuit board in aligned rows and columns including the steps of
- providing a plurality of spaced apart extraction elements aligned substantially centrally with an individual column of integrated circuit packages mounted on a printed circuit board by means of individual electrical sockets to permit interengagement between the integrated circuit packages and the electrical sockets substantially centrally of an end thereof,
- moving the printed circuit board towards the extraction elements with the integrated circuit packages oriented with the flat, top side of the packages down, to cause the extraction elements to slide betweeen the bottom side of the integrated circuit packages and the electrical sockets until the integrated circuit packages reach a preselected position,
- when the integrated circuit packages are moved to said position, initiating an extraction cycle of operation on the integrated circuit packages to remove the packages from their electrical sockets, the extraction cycle of operation including the steps of clamping the printed circuit board in a fixed position to prevent the movement thereof during the extraction cycle,
- moving the integrated circuit packages away from their electrical sockets in a direction substantially perpendicular to the longitudinal plane of the electrical sockets to extract said packages from said sockets, and
- then accumulating the removed packages at a point spaced from the point of removal.

7. A method for extracting an integrated circuit package from an integrated circuit socket as defined in claim 6 including the step of preventing the integrated circuit package from turning during its removal from the electrical socket.

8. A method for automatically extracting integrated circuit packages from electrical sockets as defined in claim 6 including the step of moving the the printed circuit board toward the extraction element to remove an integrated circuit package therefrom by repeating the above defined steps once an integrated circuit package is removed.

9. A method for automatically extracting integrated circuit packages from electrical sockets mounted on a printed circuit board, the electrical sockets being mounted on the printed circuit board in aligned rows and columns including the steps of
- providing a plurality of spaced apart extraction elements aligned substantially centrally with an individual column of integrated circuit packages mounted on a printed circuit board by means of an electrical socket to permit interengagement between the integrated circuit package and the electrical socket substantially centrally of an end thereof,
- moving the printed circuit board towards the extraction elements with the integrated circuit packages oriented with the flat, top side of the packages down, to cause the extraction elements to slide between the bottom side of the integrated circuit packages and the electrical socket until the integrated circuit package reaches a preselected position,
- when the integrated circuit package is moved to said position, initiating an extraction cycle of operation on the integrated circuit package to remove the package from the electrical socket, the extraction cycle of operation including the steps of clamping the printed circuit board in a fixed position to prevent the movement thereof during the extraction cycle,
- moving the integrated circuit package away from the electrical socket in a direction substantially perpendicular to the longutidinal plane of the electrical socket to extract said package from said socket,
- while supporting the extracted integrated circuit package, holding said package in position for a preselected interval and then causing said package to slide away from the extraction position,
- while the package is in transit, checking the condition of the leads of the package at a preselected location to determine if they have become bent during the extraction operation,
- permitting an integrated circuit package that does not have bent leads to continue to slide away from said checking location, accumulating the integrated circuit packages without bent leads at a preselected location in spaced alignment with said checking station, and momentarily arresting the travel of an integrated circuit package with bent leads at said checking location by holding the package on a platform and then tilting the platform to cause said package to be ejected and accumulated at a location spaced from said first mentioned accumulation location.

10. A method for automatically extracting integrated circuit packages from electrical sockets mounted on a printed circuit board as defined in claim 9 including the step of moving the printed circuit board towards the extraction element to said position, once an integrated circuit package is removed, to re-initiate an extraction cycle of operation.

11. A method for automatically extracting integrated circuit packages from electrical sockets mounted on a printed circuit board, the electrical sockets being mounted on the printed circuit board in aligned rows and columns including the steps of providing a plurality of spaced apart extraction elements aligned substantially centrally with an individual column of integrated circuit packages mounted on a printed circuit board by means of an electrical socket to permit interengagement between the integrated circuit package and the electrical socket substantially centrally of an end thereof, moving the printed circuit board towards the extraction elements with the integrated circuit packages oriented with the flat, top side of the packages down, to cause the extraction elements to slide between the bottom side of the integrated circuit packages and the electrical socket until the integrated circuit package reaches a preselected position, when the integrated circuit package is moved to said position, initiating an extraction cycle of operation on the integrated circuit package to remove the package from the electrical socket, the extraction cycle of operation including the steps of clamping the printed circuit board in a fixed position to prevent the movement thereof during the extraction cycle, moving the integrated circuit package away from the electrical socket in a direction substantially perpendicular to the longitudinal plane of the electrical socket to extract said package from said socket, holding said package in a position to prevent it from turning for a preselected interval and then causing said package to slide away from the extraction position, while the package is in transit, checking the condition of the leads of the package at a preselected location to determine if they have become bent during the extraction operation, permitting an integrated circuit package that does not have bent leads to continue to slide away from said checking location, accumulating the integrated circuit packages without bent leads at a preselected location in spaced alignment with said checking station, and momentarily arresting the travel of an integrated circuit package with bent leads at said checking location by holding the package on a platform and then tilting the platform to cause said package to be ejected and accumulated at a location spaced from said first mentioned accumulation location.

12. A method for automatically extracting integrated circuit packages from electrical sockets mounted on a printed circuit board as defined in claim 11 including the step of moving the printed circuit board towards the extraction element in said position, once an integrated circuit package is removed, to re-initiate an extraction cycle of operation.

13. A method for extracting an integrated circuit package from an integrated circuit socket including the steps of providing extraction apparatus having a plurality of extraction elements aligned transversely of the apparatus in a preselected location, positioning a printed circuit board having an integrated circuit package mounted on an electrical socket on the board on the extraction apparatus to permit relative movement between the board and the extraction element to permit the extraction elements to be positioned a substantial distance between the integrated circuit package and the electrical socket therefor, causing the apparatus to automatically pull the integrated circuit package from the electrical socket in a direction substantially perpendicular to the plane of the electrical socket to thereby remove the package therefrom, momentarily holding the package while it is being removed from the electrical socket, accumulating the undamaged packages at a preselected location on the apparatus spaced from the point of removal, and automatically checking the bent condition of the leads of a removed integrated circuit package while in transit on the apparatus from the point of removal.

14. Apparatus for automatically extracting integrated circuit packages having their leads mechanically mounted in individual electrical sockets therefrom comprising, extraction means having a plurality of extraction elements arranged in parallel alignment thereon and constructed and defined to receive a printed circuit board in alignment with the extraction element;

means for positioning a printed circuit board, having integrated circuit packages mounted on an individual electrical socket on said printed circuit board, on said extraction means in longitudinal alignment with the extraction elements to permit the extraction elements to be positioned between the circuit packages and the electrical sockets therefor upon the production of relative movement between said board and said extraction elements; and means operatively mounted with said extraction means and operable for automatically extracting the integrated circuit packages from their mounted sockets in response to the preselected positioning of the extraction elements between the integrated circuit packages of said sockets to pull the extraction elements and thereby the integrated circuit packages away from their individual sockets in a direction substantially perpendicular to the plane of the electrical sockets to thereby remove the packages from the sockets without bending the leads thereof.

15. Apparatus for automatically extracting an inegrated circuit package as defined in claim 14 including means for supporting the integrated circuit package during the removal of the package from the socket to prevent it from turning during its removal.

16. Apparatus for automatically extracting an integrated circuit package as defined in claim 14 including means for automatically checking a removed integrated circuit package for damaged leads.

17. Apparatus for automatically extracting an integrated circuit package as defined in claim 16 including means for automatically accumulating the integrated circuit packages without damaged leads and for ejecting said packages with damaged leads from said first mentioned means.

18. Apparatus for automatically extracting circuit packages from electrical sockets mounted on a printed circuit board, the electrical sockets being mounted on the printed circuit board in aligned rows and columns, said apparatus comprising a frame having a plurality of individual pathways arranged in columnar fashion on the frame and at a preselected incline for permitting a free integrated circuit package to descend the incline by means of an individual pathway, individual yieldable means mounted adjacent the ends of each pathway to extend into the pathways for arresting the descent of an integrated circuit package in the pathways, a plurality of spaced apart, movable extraction elements mounted on the frame in longitudinal alignment with the plurality of pathways with each extraction element individually aligned substantially centrally of an individual pathway and normally arranged at an at rest position, means constructed and defined on the frame along at least a single edge of an outer pathway for slidably receiving the side of the printed circuit board mounted thereon so that the sockets mounting the integrated circuit packages are referenced against said edge of the pathway to thereby align the integrated circuit packages substantially centrally of the individual pathways, column by column, actuation means arranged transversely of the frame and adjacent to the extraction elements for engaging an integrated circuit package and to be moved in response to the movement of said printed cricuit board up the incline, the movement of the printed circuit board up the incline causing the interengagement of an integrated circuit package and the extraction element for the corresponding pathway, extraction control means coupled to said extraction elements for moving them downwardly for extracting an integrated circuit package mounted therewith and returning said extraction elements to the at rest position, said extraction control means being normally de-actuated, switch means mounted adjacent to the actuation means to be switchably responsive to the engagement with said actuation means with an integrated circuit package for actuation of said extraction control means to move said extraction means downwardly, means mounted on the frame and arranged with said extraction control means for receiving an extracted integrated circuit package when said extraction means is in an extracted position and for permitting it to slide onto the individual pathway and to descend the incline by means of said pathway, and means for arresting the travel of an integrated circuit package mounted on the frame adjacent the end of each pathway.

19. Apparatus for automatically extracting an integrated circuit package as defined in claim 18 including means coupled to said switch means to be responsive to the extraction control means for causing the integrated circuit package to be supported during the actuation of the extraction control means to prevent the turning thereof.

20. Apparatus for automatically extracting integrated circuit packages as defined in claim 18 wherein said arresting means is yieldable to receive a transport device mounted to an individual pathway and moving the arresting means out of position to permit said packages to continue to travel into the transport device attached to the pathway.

21. Apparatus for automatically extracting integrated circuit packages from electrical sockets mounted on a printed circuit board, the electrical sockets being mounted on the printed circuit board in aligned rows and columns, said apparatus comprising a frame having a plurality of individual pathways arranged in columnar fashion on the frame and at a preselected incline for permitting a free integrated circuit package to descend the incline by means of an individual pathway, individual yieldable means mounted adjacent the ends of each pathway to extend into the pathways for arresting the descent of an integrated circuit package in the pathways, a plurality of spaced apart, movable extraction elements mounted on the frame in longitudinal alignment with the plurality of pathways with each extraction element individually aligned substantially centrally of an individual pathway and arranged at an at rest position, means constructed and defined on the frame along at least a single edge of an outer pathway for slidably receiving the side of a printed circuit board mounted thereon so that the sockets mounting the integrated circuit packages are referenced against said edge of the pathway to thereby align the integrated circuit packages substantially centrally of the individual pathways, column by column, actuation means arranged transversely of the frame and adjacent the extraction elements for engaging an integrated circuit package and to be moved in response to the movement of said printed circuit board up the incline, the movement of the printed circuit board up the incline causing the interengagement of an integrated circuit packages and the extraction element for the corresponding pathway, extraction control means coupled to said extraction elements for moving them downwardly for extracting an integrated circuit package mounted therewith and returning said extraction elements to the at rest position, said extraction control means being normally de-actuated, electrical switch means mounted adjacent the actuation means to be switchably responsive to the engagement of said actuating means with an integrated curcuit package for actuating said extraction control means, means mounted on the frame adjacent said extraction control means for receiving an extracted integrated circuit package held by the extraction control means for permitting the extracted package to slide onto the individual pathway and to descend the incline by means of said pathway, said latter means including means for momentarily arresting any movement of the integrated circuit package as said extraction elements are moved downwardly to the level of the individual pathways, and means for accumulating the released integrated circuit packages mounted on the frame adjacent the ends of each of the pathways as they descend the incline.

22. Apparatus for automatically extracting integrated circuit packages as defined in claim 21 including movable platform means aassociated with said arresting means for slidably receiving an extracted integrated circuit package to permit it to slide down the incline by means of an individual pathway, and means for testing the condition of the leads of the integrated circuit package to determine the bent condition thereof and permit only packages with unbent leads to enter a pathway.

23. Apparatus for automatically extracting integrated circuit packages as defined in claim 22 including control means operative for moving said platform means from a position in alignment with the individual pathways to a tilted position, said latter control means being operated by said extraction control means to cause the tilting of the platform means during the movement of the extraction elements to the at rest position, the tilting of the platform means causing the packages held by said testing means to be ejected away from said pathways.

24. Apparatus for automatically extracting integrated circuit packages as defined in claim 23 including means for accumulating said ejected packages.

* * * * *